United States Patent [19]

Buchele

[11] Patent Number: 4,833,445

[45] Date of Patent: May 23, 1989

[54] FISO SAMPLING SYSTEM

[75] Inventor: William N. Buchele, San Jose, Calif.

[73] Assignee: Sequence Incorporated, San Jose, Calif.

[21] Appl. No.: 742,175

[22] Filed: Jun. 7, 1985

[51] Int. Cl.[4] .............................................. H03M 1/00
[52] U.S. Cl. ..................................... 341/118; 328/151;
358/138; 364/178; 341/119; 341/120; 341/122
[58] Field of Search ...... 340/347 SH, 347 C, 347 CL,
340/347 M; 328/151; 358/138; 364/178, 179;
307/106

[56] References Cited

U.S. PATENT DOCUMENTS

| | | | |
|---|---|---|---|
| 3,278,846 | 10/1966 | Patten et al. | 324/77 |
| 3,610,958 | 10/1971 | Reiling | 307/238 |
| 3,621,286 | 11/1971 | Varrasso | 307/238 |
| 3,701,120 | 10/1972 | Charters et al. | 340/173 R |
| 3,820,112 | 6/1974 | Roth | 340/347 SH X |
| 4,117,409 | 9/1978 | O'Brien | 328/151 |
| 4,143,365 | 3/1979 | Cayzac et al. | 340/347 SH |
| 4,271,486 | 6/1981 | Dagostino et al. | 365/45 |
| 4,271,488 | 6/1981 | Saxe | 365/230 |
| 4,282,515 | 8/1981 | Patterson, III | 340/347 SH X |
| 4,283,713 | 8/1981 | Philipp | 340/347 SH |
| 4,345,241 | 8/1982 | Takeuchi et al. | 340/347 CC |
| 4,353,057 | 10/1982 | Bernet et al. | 340/347 SH |
| 4,359,690 | 10/1982 | Tucker et al. | 328/151 |
| 4,611,194 | 8/1986 | Konig et al. | 324/103 P X |
| 4,625,177 | 11/1986 | Conway et al. | 328/187 |

OTHER PUBLICATIONS

The Engineering Staff of Analog Devices, Inc., Analog-Digital Conversion Handbook, 6/1972, pp. I-84 to I-87.
The Radio and Electronic Engineer, vol. 38, No. 1, Jul. 1969, published by IERE, (London, GB) P. M. Cashin et al.: "A Novel Method for Analysing Singly-Occurring Pulses with Nanosecond Resolution", pp. 3–16.
Electronics Letters, vol. 8, No. 4, Feb. 24 1972, published by IEE (Stevenage, GB) R. Schwarte: "New Results of an Experimental Sampling System for Recording Fast Single Events", pp. 94–96.

Primary Examiner—T. J. Sloyan
Attorney, Agent, or Firm—Townsend and Townsend

[57] ABSTRACT

A fast-in, slow-out sampling system that operates at a very high sampling frequency at high accuracy. The system includes a parallel processing sampling structure controlled by a precision pulse generation system.

12 Claims, 13 Drawing Sheets

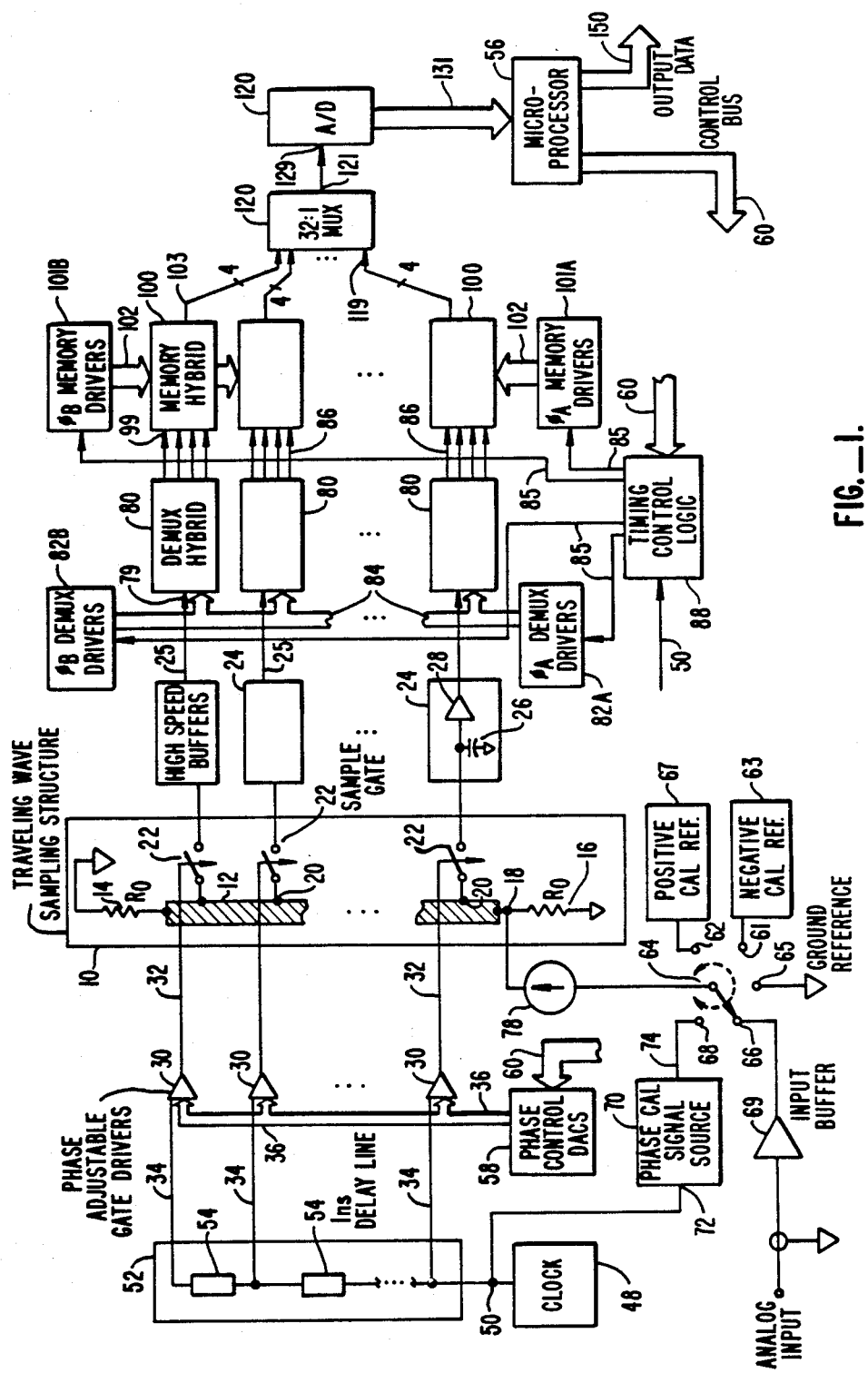
FIG._1.

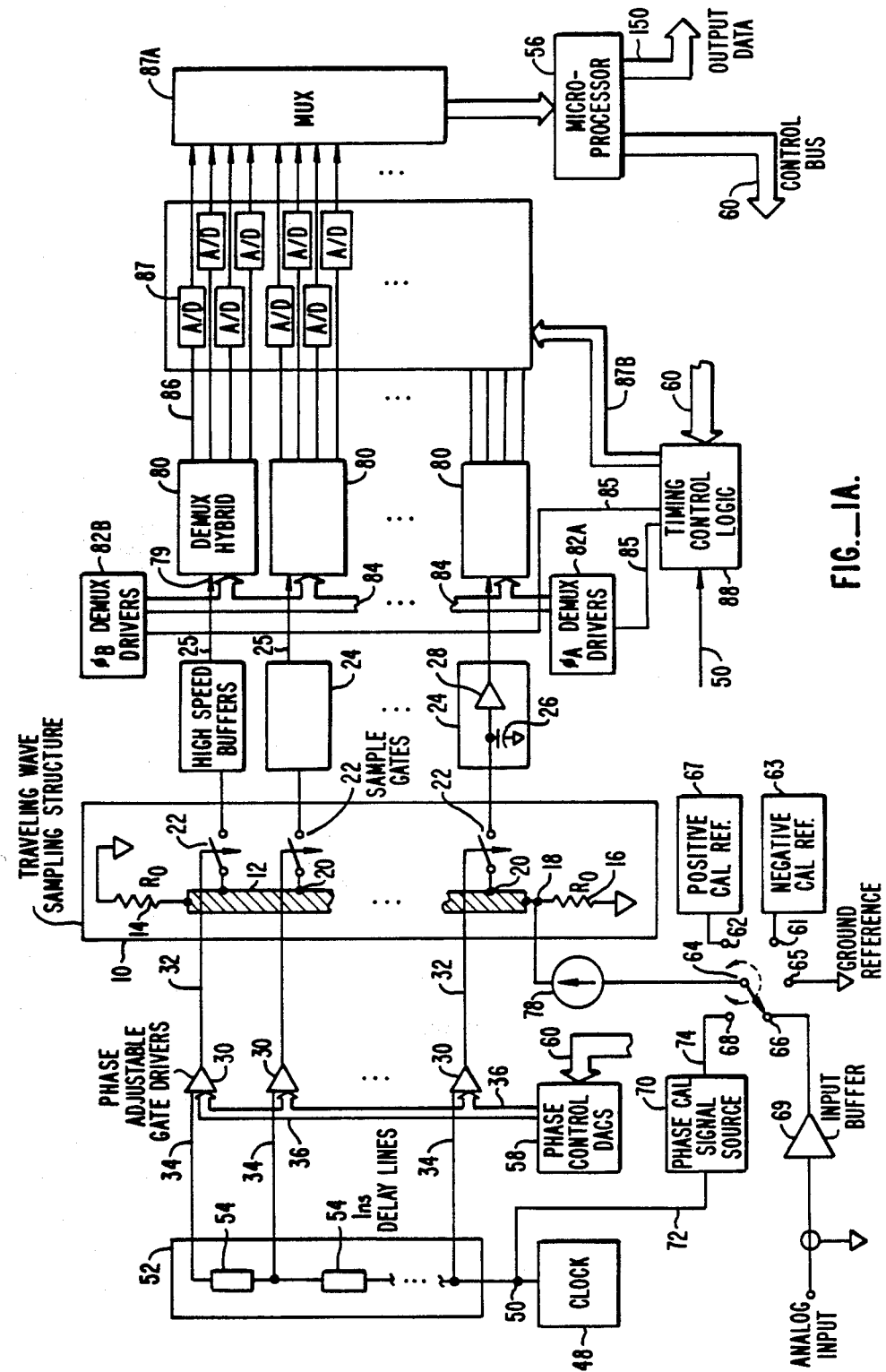
FIG._1A.

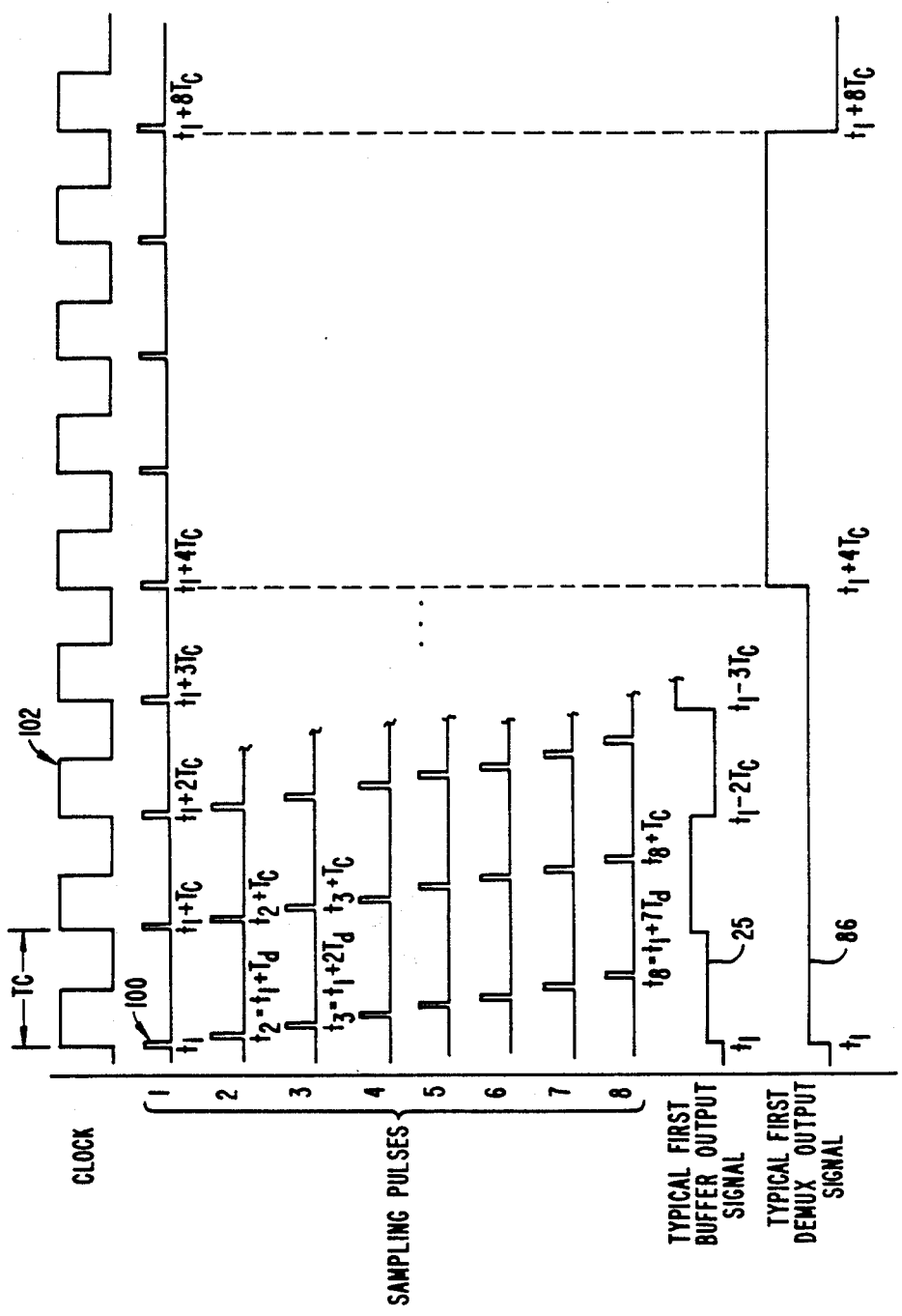
FIG._2.

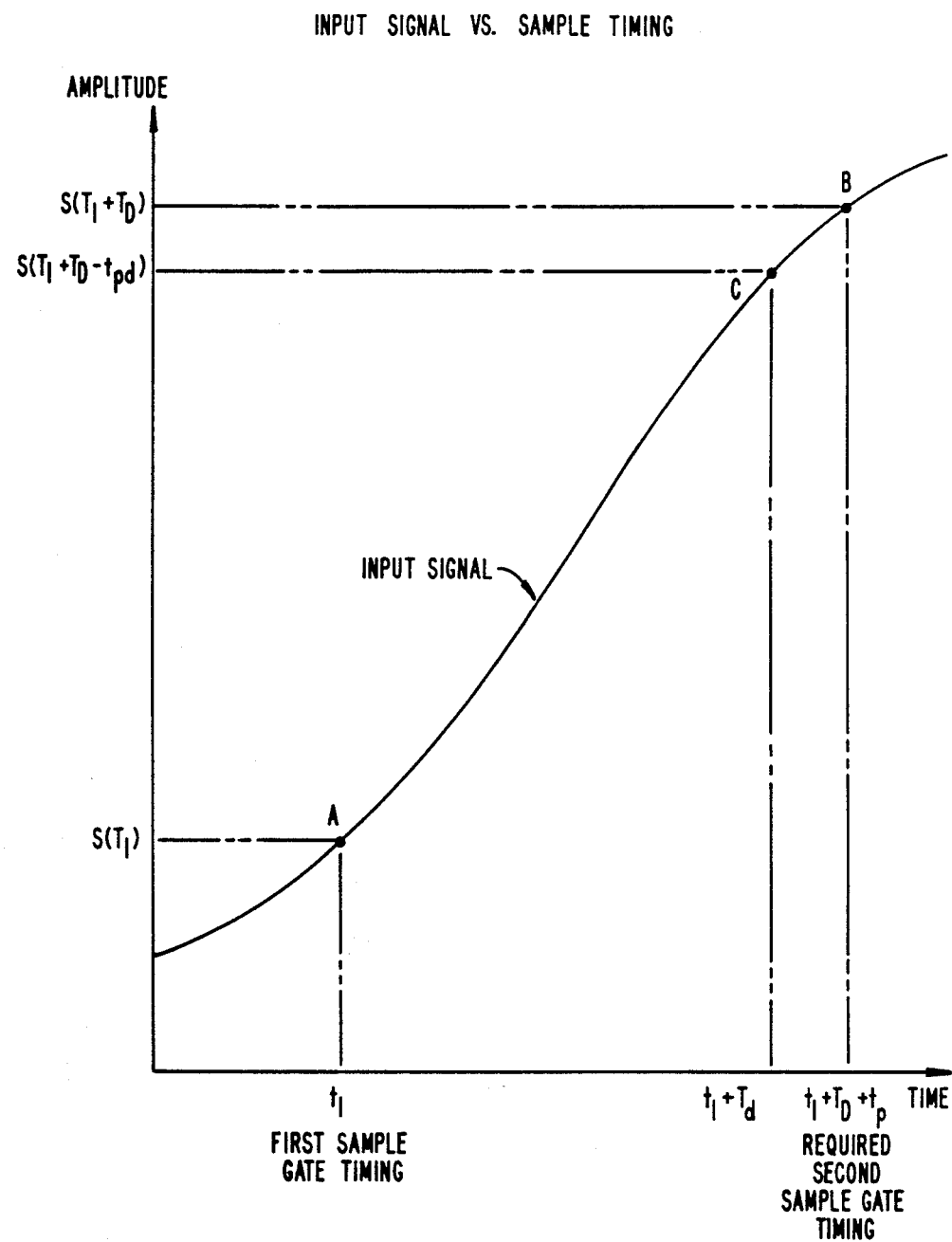
FIG._3.

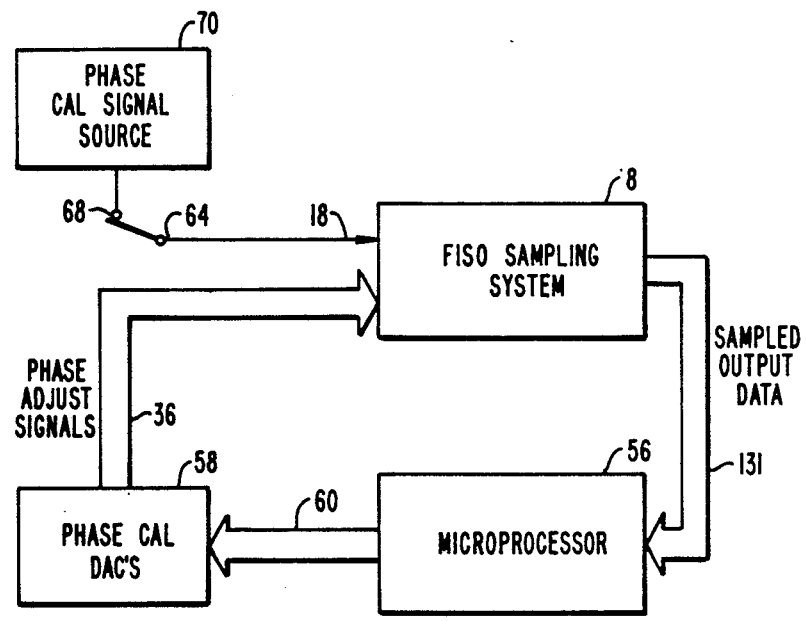
FIG._4.

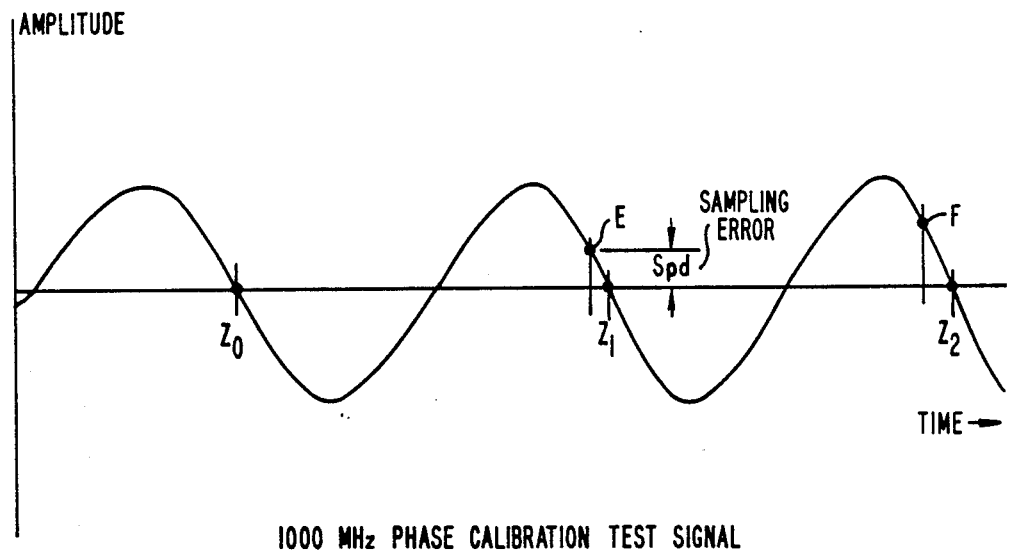
1000 MHz PHASE CALIBRATION TEST SIGNAL
FIG._5.
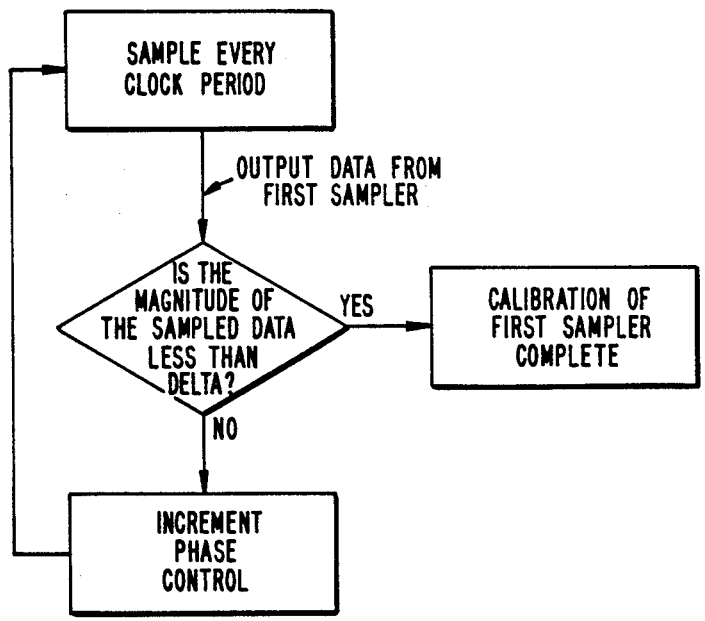
FIG._6.

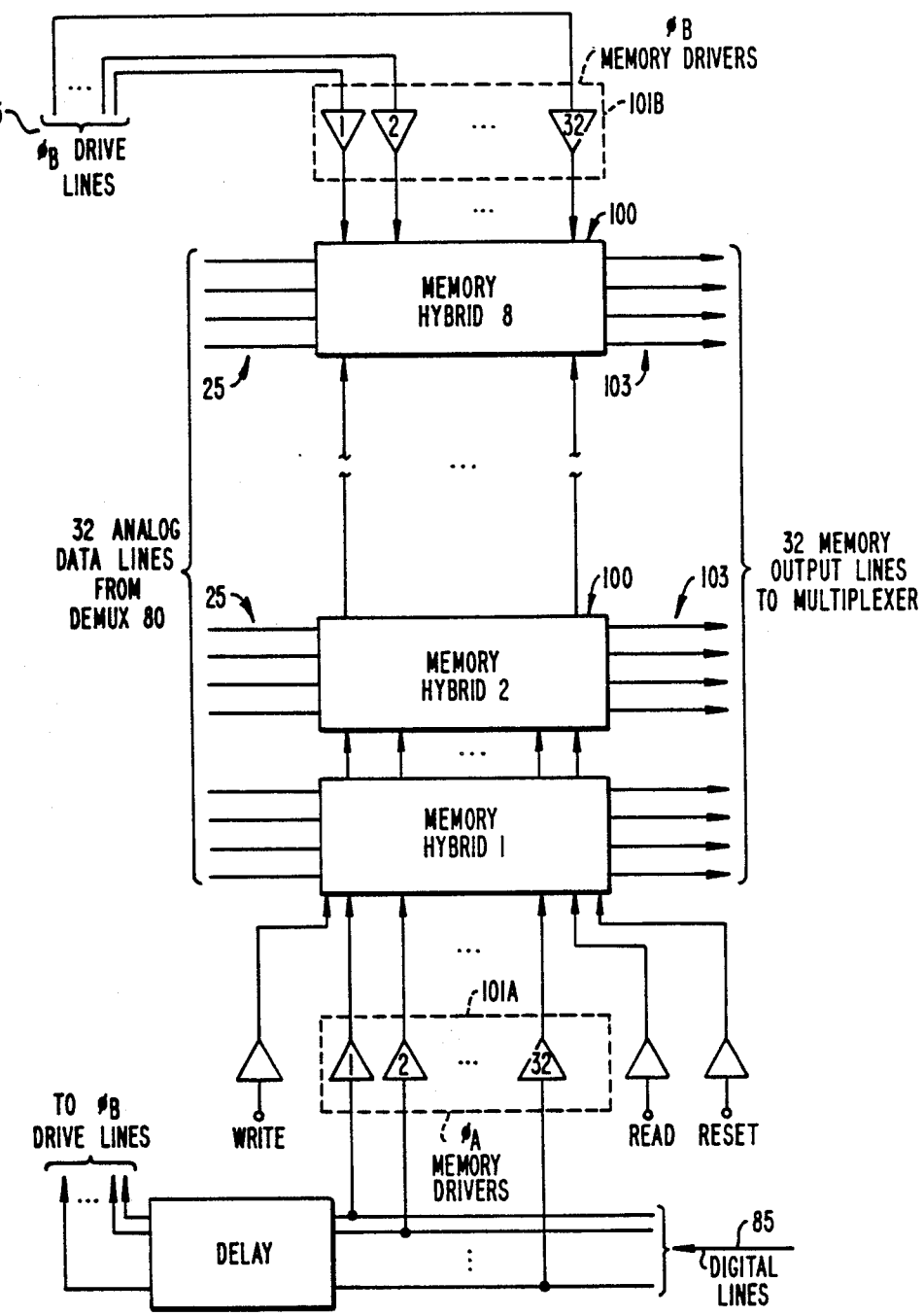
FIG._7.

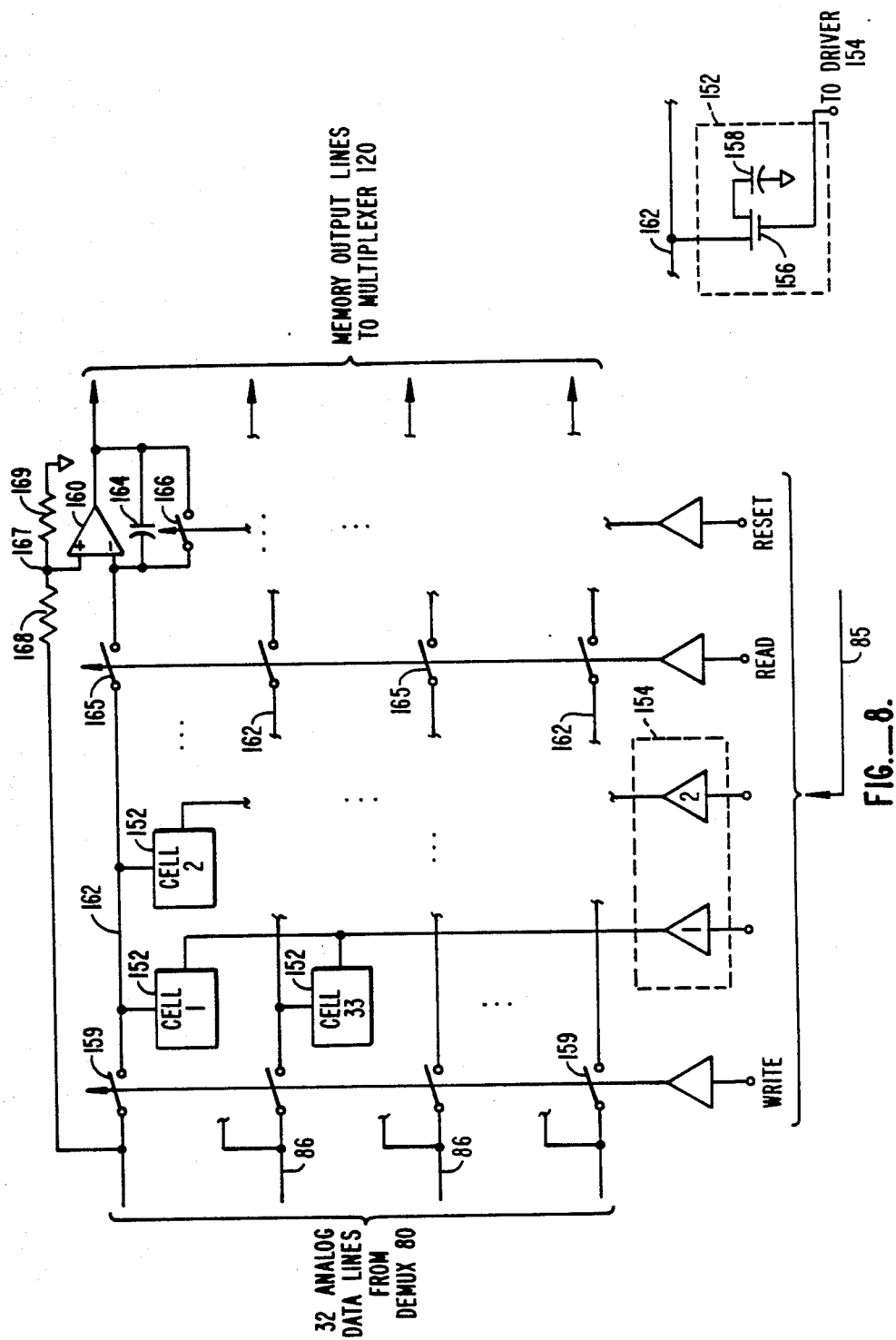
FIG._8.

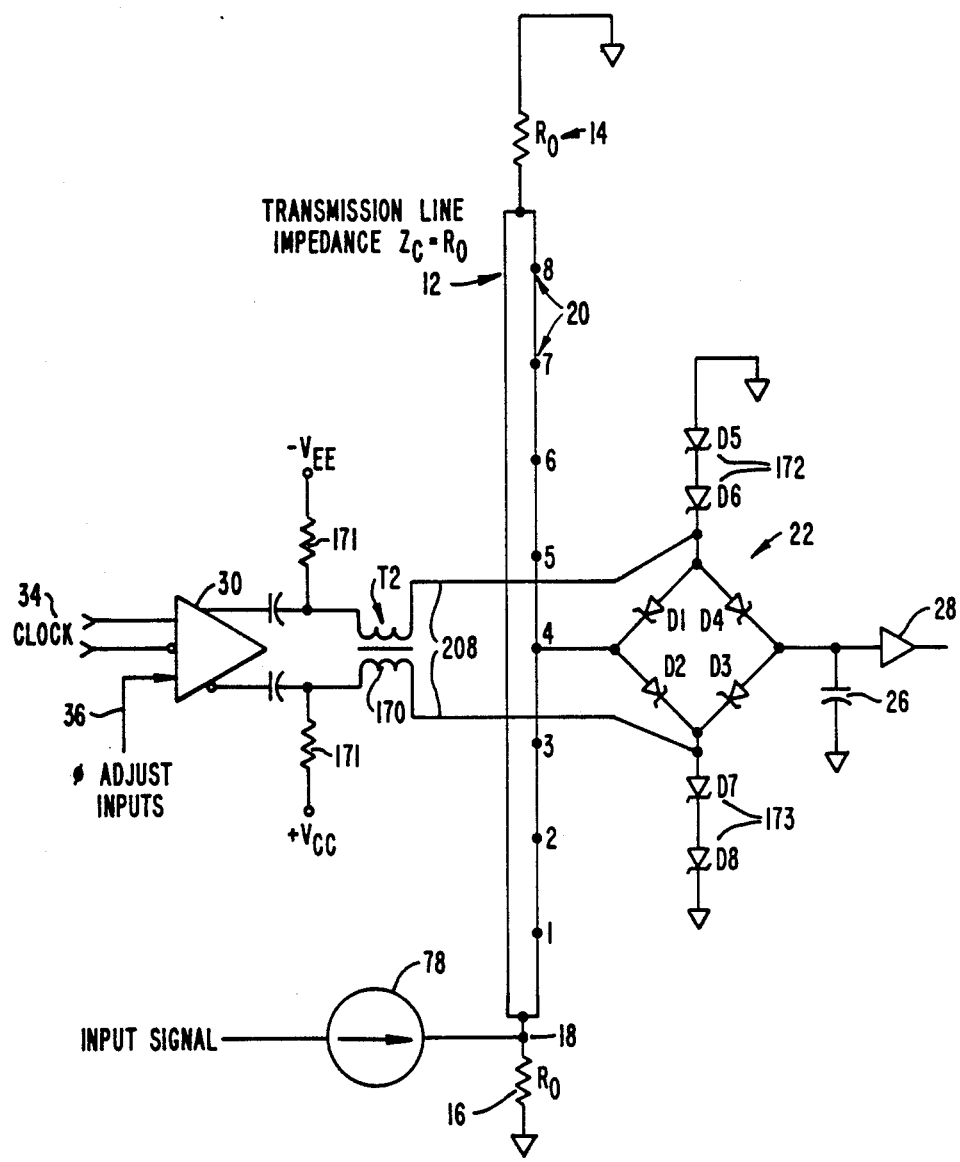
FIG._9.

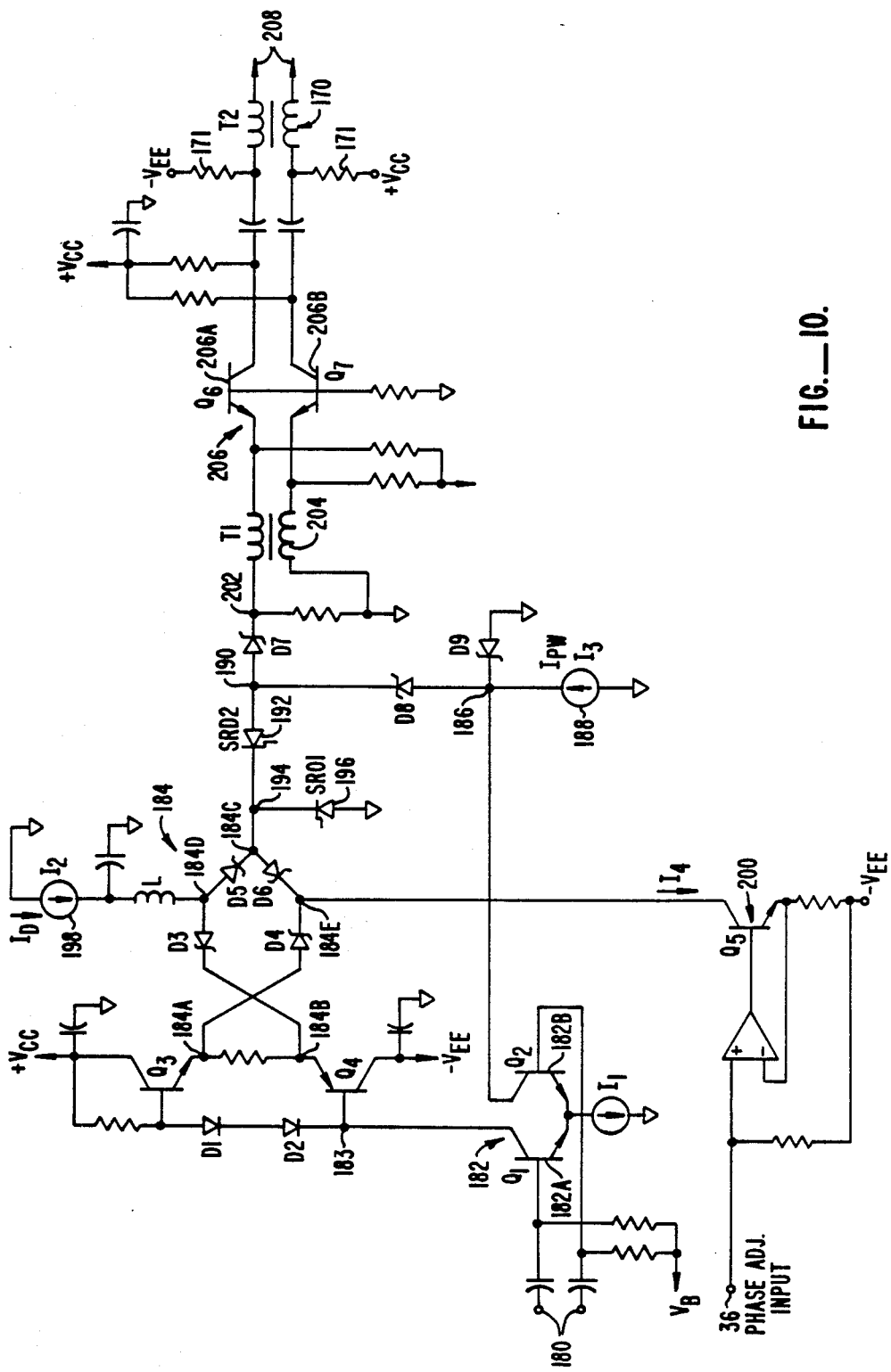
FIG._10.

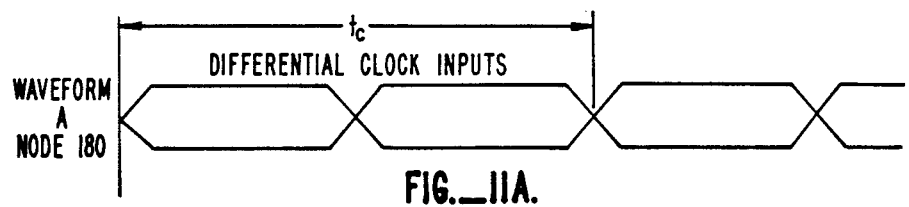
FIG._11A.
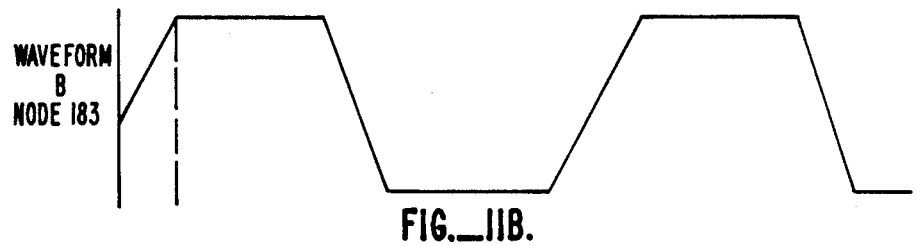
FIG._11B.
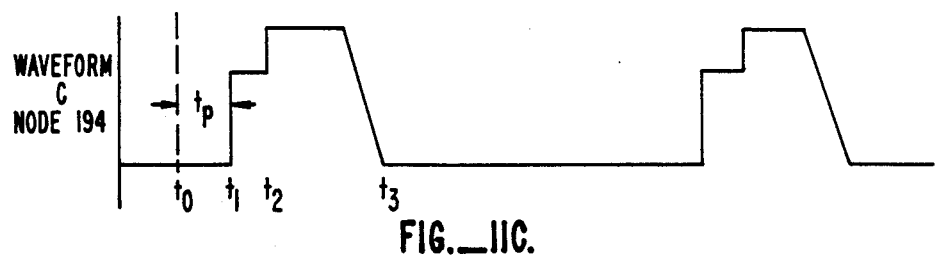
FIG._11C.
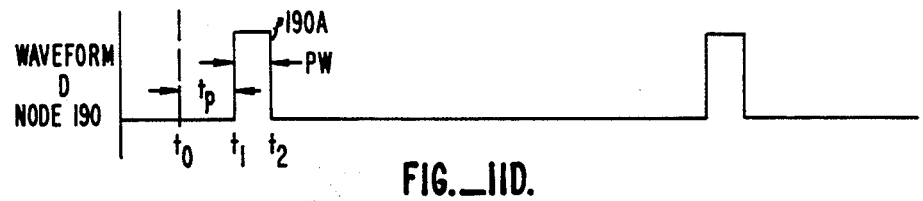
FIG._11D.
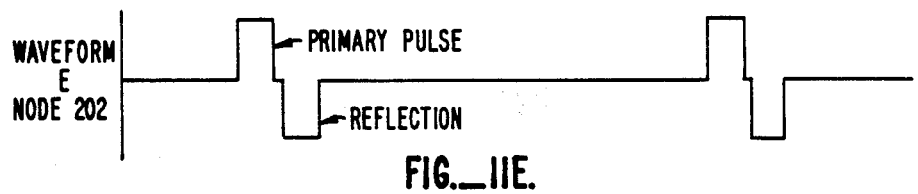
FIG._11E.
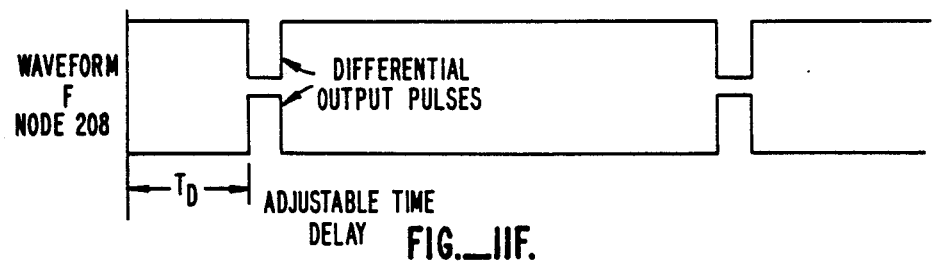
FIG._11F.

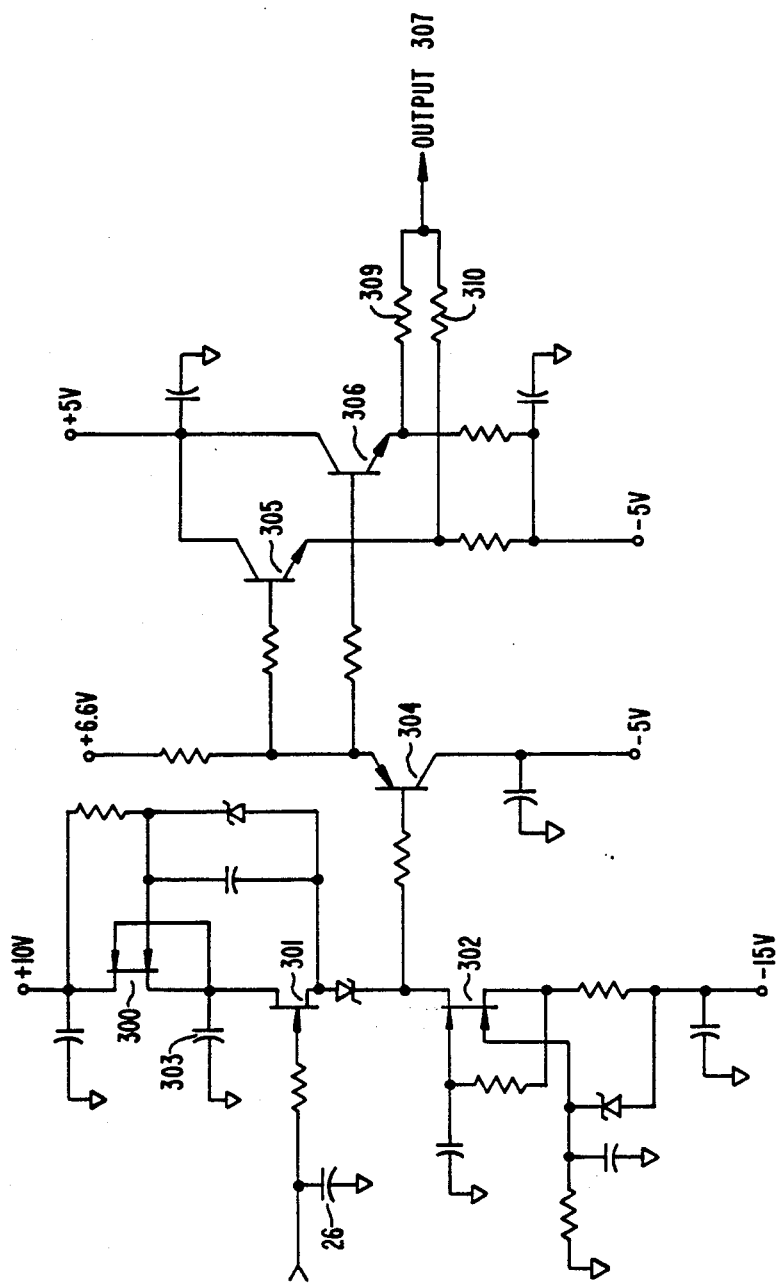
FIG._12.

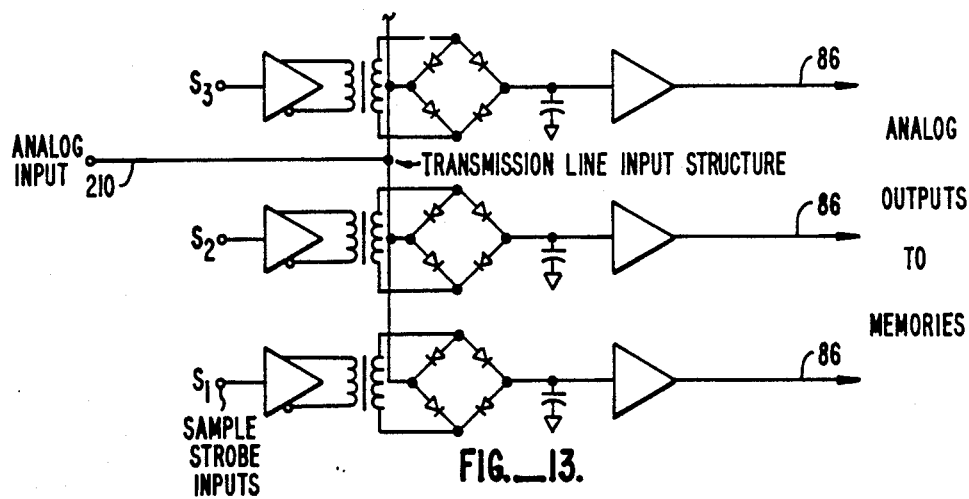
FIG._13.
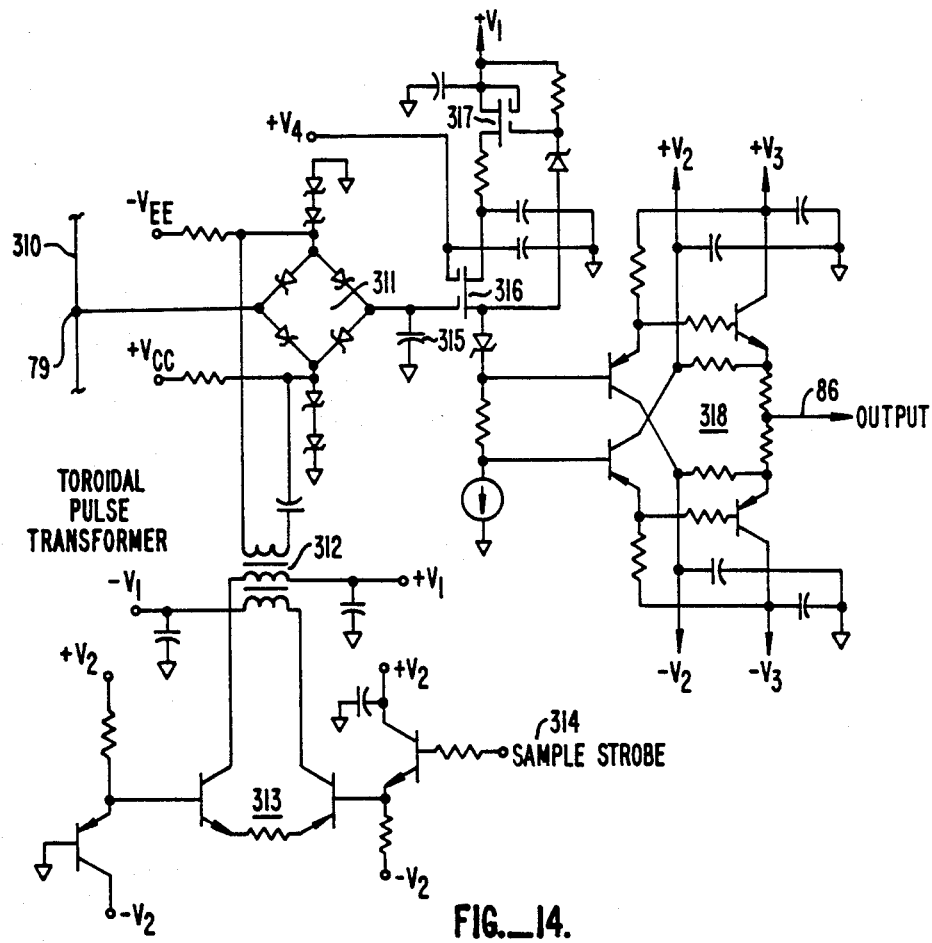
FIG._14.

FISO SAMPLING SYSTEM

BACKGROUND OF THE INVENTION

1. Field of the Invention

The invention relates generally to sampling systems and more particularly to parallel processing architectures for sampling and digitizing high frequency input signals.

2. Description of the Prior Art

Digital Storage Oscilloscopes (DSOs) and Waveform Digitizers (WFDs) are increasingly being utilized in many complex fields, such as, for example, digital electronics and memory systems, general purpose design work, automated test and production systems, communications, radar and nuclear engineering.

The particular features of DSOs and WFDs that make them so useful in these fields are:

1. Single-shot capture of transient electronic events.
2. Pre-trigger Recording which captures data prior to the leading edge of an observed electronic event.
3. Digital Storage which provides the possibility for post-acquisition data processing and long term data storage of important electronic events.
4. Enhanced Accuracy for both amplitude and time measurements.
5. Post Acquisition Data Processing which allows the user to perform Fourier transforms, averages, and other calculations for state-of-the-art measurements.
6. Digital Interface in the form of an IEEE-488 bus, or other standard buses, which facilitates complete talk/listen capability with external control or data processing systems.
7. Automatic Self-Calibration for guaranteed accuracy.
8. Automatic Set-Up of sensitivity and time base parameters provides for an exceptionally friendly human interface.
9. Built-in Diagnostics provide a self test capability to enhance trouble shooting and repair procedures.

DSOs and WFDs work by rapidly sampling, at precise intervals, a succession of instantaneous voltage levels along the input waveform to be captured. These levels are ultimately converted into a corresponding stream of binary numbers, typically, of 6 bits or more and stored in a digital memory. At this point the memory will contain an exact numerical replica of the original input waveform and is subject to additional processing, display, output or erasure.

Even though the DSOs and WFDs are the only known means of providing this impressive set of capabilities, they, surprisingly, have not yet found their way onto every laboratory bench. The reason is simple. Presently available analog to digital conversion systems are too slow and too inaccurate. Existing analog to digital conversion systems have maximum sample rates of only 100 MHz to 200 MHz, except for scan converters which are discussed later.

Most of the known conversion schemes can be fit into one of three categories:
a. Direct analog to digital conversion.
b. Scan conversion.
c. Fast-in slow-out conversion.

Direct Analog to Digital Conversion

Most low and medium speed DSOs and WFDs rely on direct, or real time, analog to digital (A to D) conversion systems. The usual architecture of these systems requires a track and hold, an A to D converter, and a high speed digital memory.

Generally, direct A to D conversion systems have the following limitations:

1. The highest speed, commercially available A to D converters operate at a 100 MHz maximum sample rate with eight bits of resolution.
2. A small number of manufacturers have A to D converters based around their own captive technology which run at 200 MHz with eight bits of resolution.
3. IC manufacturers are continuing to work on monolithic circuits based around the brute-force flash conversion scheme. Withing five years units are expected which will run at 250 MHz rates with eight bits of resolution.
4. The resolution of all known types of direct A to D converters degrades rapidly as the bandwidth of the input waveform increases. Converters which advertise eight bits of resolution for slowly varying input waveforms will typically degrade to only four bits of resolution as the input waveform approaches fifty MHz.
5. Direct A to D converters are complex and expensive.
6. The digital memory required to store the data from the A to D converter must be very fast. High speed ECL random access memory and large numbers of high speed logic elements are the usual solution. The costs associated with this approach are as great as the A to D converter itself.

Scan Conversion

The Scan Conversion approach basically utilizes analog oscilloscope technology with a built-in semiconductor target capable of taking an electronic "snap shot" of the displayed waveform. Scan Conversion systems can presently achieve bandwidths equal to the best analog scopes (1 GHz) but suffer from many of the problems inherent in analog designs. The following general observations apply:

1. Scan converters are capable of single-shot waveform capture and digital output.
2. The effective sample rates extend well into the GHz REGION.
3. They are incapable of pre-trigger recording of electronic events, which is an extremely important feature normally associated with DSOs and WFDs. The lack of this capability is a very serious flaw and is sufficient in itself to remove scan conversion from consideration as the basis of a general purpose DSO.
4. Technicalities associated with the electron beam deflection process utilized in scan converters limits their accuracy to approximately ±2%, which is greatly inferior to standard eight bit (±0.4%) DSOs.
5. Scan conversion requires expensive diode target arrays mounted inside of a precision vacuum tube structure and wide band electron beam deflection systems.
6. Extensive post processing of acquired data is necessary to "clean up" defects which are introduced into the data by faults in the diode target array and the scan process. As a consequence, time delay, which is deemed excessive for general purpose DSOs, is introduced between data acquisition and display.

Fast-in, Slow-out Conversion (FISO)

The Fast-in, Slow-out conversion approach utilizes an analog memory device which records input waveforms at high speed and subsequently "outputs" the recording at low speed. The greatly slowed output waveform is then digitized by a low speed, inexpensive A to D converter and stored in digital memory. The ratio between the input rate and the output rate can typically be as great as 1,000 to 1.

This conversion approach is attractive due to its simplicity and consequent cost advantages. Charge coupled devices (CCDs) are most often employed as the analog memory.

Two manufacturers presently supply medium speed (40 MHz to 125 MHz sample rates) DSOs based around CCDs. Additionally, Lawrence Livermore Labs has demonstrated a system which uses five CCDs operating in parallel to obtain a sample rate of 1000 MHz. Such high speed CCDs are not commercially available. They are presently "hand built" experimental devices that suffer from many problems including timing errors, non-linearities in the recording process, charge transfer inefficiencies and noise. The cumulative effect of these problems is reduced resolution. Present measurements indicate that at their maximum sample rate, the Lawrence Livermore CCDs can provide eight bits of resolution if the output data is subjected to extensive error correction processing.

An example of a FISO system utilizing CCDs is disclosed in U.S. Pat. No. 4,353,057 (Bernet).

In many of the above-listed fields of application, it would be especially advantageous to have DSOs and WFDs capable of sampling at a 1,000 MHz sampling rate or greater and of resolving data to 10 bits. However, achieving such a high sampling rate requires overcoming major difficulties.

The first difficulty stems from the complete lack of commercially available devices which were designed with the intention of building A to D conversion systems which run at 1,000 mega-samples per second. The highest speed A to D conversion components available run at only 100 MHz. No existing system will provide ten bit resolution data conversion products or components at speeds greater than 30 MHz. The second class of difficulties involve inherent physical limitations and constraints, which are encountered in the design of very high speed sampling systems. These limitations can be divided into two fundamental categories:

1. Factors which limit the maximum rate of the sampling process.
2. Factors which limit the accuracy of the sampled data.

The factors which limit the rate of the sampling process are invariably related to the physical properties of the electronic devices employed to do the sampling. At a rate of 1,000 MHz, the sampling circuitry must acquire, process, store, and clear itself of a given sample in preparation for the next, within one nanosecond. Even with high speed GaAs Fet technology, experimental converters have been demonstrated with only 2 or 3 bits of resolution which would be useless for DSO and WFD applications.

The only available alternative based on the limitations inherent in all known forms of technology is to adopt a parallel processing type of architecture. The parallel processing technique enables very high overall sample rates to be achieved while permitting individual data channels to function at considerably lower rates. For example, if a waveform is alternately acquired by two sampling devices running at 500 MHz the effective overall sample rate becomes 1,000 MHz. The system disclosed in Bernet is an example of a FISO converter utilizing CCDs in a parallel processing architecture.

However, the parallel processing architectrue is not as simple a solution as it would first appear. While it does indeed solve the speed problem, it introduces serious implications with regard to accuracy. As the frequency of the waveform to be acquired increases, three critically important factors, if not controlled, destroy the accuracy of the sampled data in parallel sampling systems. They are as follows:

1. The timing of the interleaved sampling gates must be controlled to an extremely high degree of precision.
2. The multiple parallel channels must be tightly matched with respect to gain, offset, linearity, dynamic response and thermal drift.
3. Interactions between multiple sampling gates connected to a common input node must be highly suppressed.

Considering the timing problem, for example, one LSB (least significant bit) in a ten bit resolution system spans the voltage equal to 1/1024 of the full scale input signal. To acquire a 100 MHz sine-wave to an accuracy of 1 part in 1,024 at the point of maximum slew rate requires that the timing uncertainties at the precise moment the sample is taken to be less than:

$$T = \frac{V/LSB}{V/2 \, d \, (\sin wt)/dt} \text{ Evaluated at } t = 0 \quad (1)$$

T equals the maximum allowable timing error per LSB where V equals full scale input voltage $$T = \frac{1/1024}{\pi \, (100 \text{MHz})} = 3.1 \text{ picoseconds}/LSB \quad (2)$$

Accordingly, a means for controlling timing accuracy in a parallel sampling architecture to the high precision indicated in the above equation is greatly needed in the art.

The accuracy of a parallel processing conversion system is also critically dependent on channel to channel matching. A 10 bit resolution conversion system requires that offset, gain, linearity, dynamic response, thermal drift and component aging, all remain matched on a channel to channel basis to better than 1/10% accuracy. Very high speed samplers, buffers and so forth tend to be poorly controlled with respect to the above mentioned parameters largely due to the basic physics of the microwave type semiconductor devices which are presently available. Consequently, a simple, inexpensive means to effectively match these parameters is also greatly needed in the art.

Further, a system that suppresses interactions between sampling gates coupled to a common input node is required to achieve the above-described speed and accuracy is required in the art.

SUMMARY OF THE INVENTION

The present invention is a system for sampling high bandwidth (100 MHz or higher) transient signals that achieves very high sample rates (on the order of 1 GHz and higher) while simultaneously providing very high accuracy (on the order of 10 bits).

A preferred embodiment is a FISO (fast-in, slow-out) type parallel processing conversion system which, in order to attain high accuracy, utilizes automatic self-optimization of timing and other parameters by means of a microprocessor controlled calibration technique.

The automatic calibration up-date rate will occur as often as necessary to guarantee all performance specifications. Other novel aspects of the invention suppress the previously mentioned interactions of multiple sampling gates connected to a common node and help to eliminate the previously mentioned channel to channel mismatch problems.

In one embodiment, the system includes a transmission line having terminal impedance matched to the characteristic impedance of the transmission line. The transmission line has an input terminal for receiving an input signal. N sampling terminals are equally distributed along the transmission line. Each sampling terminal is coupled to a sampling gate that samples the value of the input signal at the sampling terminal upon receipt of a sampling pulse. Each sampling gate is coupled to the input an output buffer which holds the value of the sampled signal for the period between sampling pulses and provides an output signal equal to the value of the sampled input signal. This output signal is provided at a buffer output port.

A system clock generates a clock input signal, Q, having frequency $f_C$ and period $T_C$.

Each sampling gate is coupled to a sampling gate driver. The sampling gate driver receives a clock signal, at time $t_I$, and a phase control signal. The sampling gate driver generates a sampling pulse that activates the sampling gate at time $t_S$ where $t_S$ is equal to $t_I + t_P$. Where $t_I$ is the time that the clock input signal is received at the sampling gate driver and $t_P$ is a variable phase delay having a magnitude determined by the phase control signal.

A clock signal delay system delays the receipt of the clock input signal at successive sampling gate drivers by a time delay $t_D$ where $t_D$ is equal to the period of the clock signal, $t_C$ divided by the number of sampling gates. The resulting overall sampling rate of the sampling gates is equal to $Nf_C$.

A phase control signal generating system generates phase control signals that are directed to each sampling gate driver. The magnitude of each phase control signal is controlled to vary the magnitude of $t_P$ at each driver to compensate for input signal propagation delay and variations of the dynamic characteristics of the sampling circuits.

The output port of each high speed buffer is coupled to the input of a DEMUX. The DEMUX has M outputs for providing M successive buffer outputs occurring over a period of $Mt_C$. Accordingly, the output data rate of each DEMUX is equal to $1/M\ f_C$.

According to a further aspect of the invention, the output of the DEMUXs are coupled to inputs of an analog memory array. In one embodiment, these memory arrays are hybrid memory modules. According to another aspect of the invention, a hardware offset error correction resistive network subtracts system offset errors from stored analog data as data is read out of the memory array.

In an alternative embodiment, a high-speed analog digital converter is coupled to each of the DEMUX outputs. The outputs from the high-speed analog digital converters are multiplexed to provide a continuous digital output data stream.

According to a further aspect of the invention, the sampling gate drivers include a precision step recovery diode (SRD) pulse generating system for generating a high precision controlled sub-nanosecond sample pulse.

According to a further aspect of the invention, each sampling gate is a diode bridge activated by the sampling pulse generated by the sampling gate driver. In one embodiment the diodes are Schottky diodes.

According to a further aspect of the invention, the system for generating the N phase control signals includes a phase calibration signal generator for providing a test signal having a frequency that is a multiple, or fractional multiple, of the clock signal. The output data generated by the FISO-sampling system when sampling the test signals is in turn sampled. This sampled output data is utilized for adjusting the magnitude of the phase control signals to adjust the magnitude of the test output data to pre-determined values.

Accordingly to another aspect of the invention, the physical size of the transmission line structure and the termination resistors at each end of the transmission line are optimized to quickly absorb the sampling transients associated with the operation of the sampling gates.

According to a further aspect of the invention, the sample pulse generating system includes a pair of step recovery diodes. One of the step recovery diodes, the phase control SRD, is utilized to control the position of the sampling pulse relative to the phase of the clock signal. The other one of the step recovery diodes, the pulsewidth control step recovery diode, is utilized to control the width of the sampling pulse. The step recovery diodes are charged during a first cycle of the clock signal by controlling the magnitude of a pulsewidth current, $I_{PW}$ and a phase control current, $I_{PC}$. The charging current for the pulsewidth control step recovery diode is equal to $I_{PW}$ and the charging current for the phase control step recovery diode is equal to $I_{PW} - I_{PC}$.

During a second phase of the clock signal the SRDs are reversed biased. The recovery time of the phase control step recovery diode determines the position of the pulse relative to the clock signal and the recovery time of the pulsewidth control step recovery diode controls the width of the sampling pulse.

Each DEMUX module is itself a multiphase resampling subsystem similar in many respects to the input sampler already described. The DEMUXs serve to increase the total number of parallel signal channels and proportionally reduce the data rate of each channel. Note that the DEMUXs only resample the relatively stable outputs of the preceding high speed buffers which eliminates the need for high precision control of the DEMUX aperture timing. However, once again the size and construction of the DEMUX transmission line sampling structure must be optimized to quickly suppress sampling transients associated with the operation of the multiple resampling gates.

The DEMUX resample timing is provided by the DEMUX drivers and driver control logic and is synchronous with the system clock. Two phases (A and B) are provided to remove time skews associated with the 1 ns steps between input samples.

The outputs of the DEMUX modules are applied (during the write mode) to the memory modules which consist of switched capacitor memory arrays. During the readout mode, the switched capacitor memory elements are similarly connected to output circuits within the memory modules which perform the functions of reading the memory elements, buffering them so as to provide a high drive level to subsequent multiplexing circuitry and providing, in an elegant manner, a high degree of system error correction described more fully below.

A multiplicity of memory elements within the memory modules are accessed in parallel by the memory drivers. Once again two phases of memory drivers are required to remove the remainder of the input timing skews as previously described.

In the read mode, the memories are clocked at a greatly reduced rate and the resulting outputs are applied in parallel to a multiplexer which in turn cyclically applies the sampled analog data to an analog to digital (A/D) converter for digitization. The output data now in digital form is next transferred to the microprocessor subsystem which provides error correction, internal calibration, data processing and data output.

An additional microprocessor controlled calibration loop utilizes positive and negative input voltage references as well as a ground reference to determine channel to channel DC offset and gain correction factors. These periodically determined correction factors are utilized by the microprocessor to match the gain and offset parameters associated with each channel.

Other aspects of the advantages of the present invention will be apparent from the following detailed description of the preferred embodiments with reference to the drawings.

BRIEF DESCRIPTION OF THE DRAWINGS

FIG. 1 is a block diagram of a preferred embodiment of the invention.

FIG. 1A is a diagram of an alternative embodiment of the invention having high-speed and analog to digital converters directly coupled to the DEMUX outputs.

FIG. 2 is a timing diagram illustrating the operation of the preferred embodiment of the invention.

FIG. 3 is a graph illustrating sampling error due to propagation of the transmission line.

FIG. 4 is a block diagram of the automatic phase calibration loop.

FIG. 5 is a graph depicting sampling error due to improper phases.

FIG. 6 is a flow chart for the phase control signal generation loop.

FIG. 7 is a block diagram of the memory array.

FIG. 8 is a circuit diagram illustrating the memory array architecture.

FIG. 9 is a detailed schematic diagram of the input travelling wave sampling structure.

FIG. 10 is a circuit diagram of a high speed phase adjustable pulse generator.

FIGS. 11A–11F is a timing diagram illustrating the operation of the circuit depicted in 10.

FIG. 12 is a circuit diagram of a high-speed buffer.

FIG. 13 is a block diagram of a DEMUX.

FIG. 14 is a circuit diagram of a single channel of the DEMUX.

DETAILED DESCRIPTION OF THE PREFERRED EMBODIMENTS

The preferred embodiment is a FISO sampling structure having a sampling rate of 1,000 MHz. The system includes an adaptive calibration loop to calibrate the timing of the sampling gates and to calibrate the gain and offset of the multiple parallel channels so as to provide both high speed and high accuracy.

FIG. 1 is a block diagram of the overall sampling architecture. Referring now to FIG. 1, a traveling wave sampling structure 10 includes a transmission line 12 having terminal impedances 14 and 16. The transmission line also includes an input terminal 18 for receiving an input signal. A set of eight sampling terminals 20 are equally distributed along the transmission line 12. The separation between the sampling terminals is equal to D.

The traveling wave sampling structure 10 also includes eight sampling gates 22 with each sampling gate 22 coupled to a sampling terminal 20. The sampling terminals 20 are sequentially numbered for identification with the first sampling gate being closest to the input terminal 18. All circuit elements coupled to a given sampling terminal 20 are given the same identifying number as the corresponding sampling terminal 20, e.g., the first sampling gate 22 is coupled to the first sampling terminal 20.

The output of each sampling gate 22 is coupled to the input of a high speed sampling gate output buffer 24, with each output buffer 24 including a hold capacitor 26 and a high impedance buffer 28. Each sampling gate is also coupled to a bridge driver 30. Each bridge driver 30 has sampling pulse outputs 32, coupled to a corresponding sampling gate 22, a clock signal input 34, and a phase control input 36.

A clock 48 provides a clock signal at clock output 50. The clock output 50 is coupled to the clock input signals 34 of the bridge drivers 30 by a clock signal delay system 52 including daisy chained delay lines 54.

A microprocessor 56 provides digital phase control signals for each of the bridge drivers 30. These digital control signals are coupled from the microprocessor 56 by a data bus 60 to the input of latching digital to analog converters 58. The outputs of the DACs 58 are in turn coupled to the phase control input 36 of the corresponding bridge driver 30.

During the calibration cycle phase a controllable switch 64 couples the input terminal 18 of the transmission line 12 to poles 61, 62, 65, 66 or 68. A calibration signal generator 70 has an input 72 coupled to the clock output 50 and an output 74 coupled to the switch pole 68. The first pole 66 is coupled to the input buffer 69 carrying the input signal to be sampled. A current driver 78 couples the poles of the switch 64 to the input terminal 18 of the transmission line 12. During the gain and offset calibration cycle the switch 64 sequentially couples poles 61, 62, 68 and 65 to the transmission line 12. Pole 62 is coupled to the positive calibration reference, pole 61 is coupled to the negative calibration reference and pole 65 is coupled to the ground reference.

The output ports 25 of each high speed sampling gate output buffer 24 are coupled to an input port 79 of a corresponding demultiplexer (DEMUX) 80. The demultiplexers 80 are coupled to DEMUX drivers 82A and B by strobe lines 84. The DEMUX drivers are in turn connected to timing control logic 88 by digital lines 85. Each demultiplexer 80 has four output ports 86.

The output ports 86 of each DEMUX 80 are coupled to the inputs 99 of hybrid memory module 100. The memory modules 100 are coupled to memory drivers 101A and B by strobe lines 102.

Each memory module 100 provides four outputs 103 directed to the inputs 119 of multiplexer 120. The multiplexer output 121 is coupled to the input 129 of ADC 130.

Digital output signals from the ADC 130 are transferred to the microprocessor by bus 131. The microprocessor 56 provides control data to phase control DACs 58 along bus 60 and output data on bus 150.

The operation of the circuit depicted in FIG. 1 will now be described. The bridge drivers 30 generate a subnanosecond sampling pulse upon receipt of the clock input signal at the clock signal input 34. This sampling pulse is a high precision, very stable, controlled pulse that facilitates the high sampling rate of the present system. Circuitry for generating this pulse will be described below with reference to FIG. 10. The position of the sampling pulse may be finely controlled by varying the amplitude of the phase control signal supplied to the phase control input 36 of the bridge driver 30. For clarity the operation of the system will first be described without reference to the phase control system. The details of the phase control system will be fully described below.

Referring now to the first sampling gate and associated circuitry, the holding capacitor 26 is charged to a voltage level representing a previous sample of the input signal. Both the sampling gate 22 and the high impedance buffer 28 provide high impedance loads to the hold capacitor 26 and prevent it from discharging. The output of the high speed buffer 24 indicates the value of the voltage level stored on the hold capacitor 26.

FIG. 1A depicts an alternate embodiment. In FIG. 1A each DEMUX output 86 is coupled to a high-speed analog to digital converter 87. The outputs from the ADCs 87 are multiplexed by MUX 87A. Timing strobes 87B clock ADCs 87 in synchronism with data outputs 86 of DEMUXs 80.

FIG. 2 is a timing diagram illustrating the operation of the system. In FIG. 2, the position of the sampling pulses 100 relative to the clock signal 102 is depicted. The frequency of the clock signal 102 is $f_C$ and the period is $T_C$. In the present embodiment $f_C$ is 125 MHz.

The clock signal 102 is received at the clock input of the first reference driver 30 with minimal delay. Accordingly, the sampling pulse is generated at time $t_1$ where $t_1$ is equal to the time that the clock signal goes high.

The clock signal input at the second bridge driver is delayed by one time delay unit, $t_D$, and thus the sampling pulse to the second sampling gate is generated at time $t_2 = t_1 + t_D$. In the present embodiment $t_D$ is equal to one nanosecond.

The receipt of the clock signal at each succeeding bridge driver 30 is delayed by $t_D$ as depicted in the diagram. Note that $t_D$ is the period of the clock signal, $T_C$, divided by the number of sampling gates. Thus, the second sampling pulse at the first sampling gate is generated at $t_D$ after the sampling pulse generated at the eighth sampling gate. Accordingly, the system samples the input signal at a sampling rate $f_S = 1/t_D$. Because $t_D$ is equal to $T_C$ divided by the number of sampling gates, the overall sampling rate is equal to the clock frequency, $f_C$, multiplied by the number of sampling gates. In the present embodiment, the clock signal frequency is 125 MHz and the overall sampling rate is 1,000 MHz.

Examination of FIG. 2 illustrates that the period between sampling pulses for any given sampling gate is equal to the period of the clock signal, $T_C$. Accordingly, the outputs from the sampling gate are clocked at the clock frequency, $f_C$. Thus, for example, the first output buffer signal 25, changes at the clock rate.

The demultiplexer 80 includes secondary sampling gates, gate drivers, and hold capacitors for holding the DEMUX input signals and high impedance buffers for providing DEMUX output signals. See FIGS. 13 and 14 and detailed description of DEMUX circuit. The DEMUX inputs are clocked at the clock rate, $f_C$, to sample the buffer outputs. In particular, the first DEMUX samples the four outputs of the first high speed buffer 24 at times $t_1$, $t_1 + T_C$, $t_1 + 2T_C$, and $t_1 + 3T_C$. Referring to FIG. 2, the first DEMUX output 86 of the first DEMUX module 80 will update at $T_C$, $4T_C$, and so forth. Similarly, the first DEMUX output 86 of the second DEMUX module will update at $T_C + t_D$, $4T_C + t_D$, $8T_C + t_D$ and so forth with similar time increments applying to all 32 DEMUX outputs 86. Thus, each output signal from the DEMUX 80 may be read at ¼th the clock frequency, $f_C$. In the present embodiment, the DEMUX output signal data rate is 31.25 MHz.

In FIG. 2, the sampling pulses (1 through 8) are progressively delayed by the time increment $T_C$. Therefore the timing transitions associated with the corresponding buffer outputs 25 will exhibit essentially the same skewed timing characteristic. In this embodiment two pulses (A and B) of the DEMUX strobes are utilized to resample the time skewed outputs of the buffers 24. The phase A strobe is provided to DEMUX 1 through 4 and the phase B strobe to DEMUX 5 through 8.

The sampling architecture of FIG. 1 functions to achieve a sampling rate of eight times the frequency of the clock signal while providing data at a rate equal to one fourth times the clock signal. However, sampling an input signal at 1,000 MHz requires precision pulses positioned by the adaptive phase control system which will now be described.

It is well known in the art that a transmission line must be utilized to propagate signals on the order of 1,000 MHz. In the present system, a thick film hybrid microstrip transmission line structure is utilized. A signal on the transmission line propagates at a finite group velocity, $V_G$.

This finite group velocity causes a propagation delay, $t_{PD}$, between the sampling terminals 20 on the transmission line 12. In the present embodiment, the sampling terminals 20 are separated by about 0.1 inches. The time for a signal to propagate from the input terminal 18 to the end of the transmission line 12 is about 170 picoseconds.

The sampling error introduced due to this propagation delay will now be illustrated with reference to FIG. 3. FIG. 3 is a graph of the amplitude of an input signal measured at the first sampling terminal 20 as a function of time.

In FIG. 3, point A of the input signal is measured at the first sampling gate at time $t_1$. The amplitude of the signal at point A is $S(t_1)$. It is desired to sample the signal system at point B, when the amplitude of the signal is $S(t_1 + t_D)$, at the second sampling gate 22.

As described above with reference to FIG. 2 the second sampling gate is clocked at time $t_2 = t_1 + t_D$. However, when the second sampling gate is clocked it samples the input signal at point C where the magnitude of the input signal is $S(t_1 + t_D - t_{PD})$. The activation of the second sampling gate 22 must be delayed to compensate for the propagation delay, $t_{PD}$. Therefore, the second sampling gate 22 must be clocked $t_1 + t_D + t_P$ to sample the input signal at point B, where $t_P$ is a phase correction time having its magnitude determined by the phase correction signal 36.

Because of the timing accuracy required for very high speed sampling, uncontrollable variations in the parameters of the circuit elements utilized in the sampling gates and other circuitry prevent the implementation of the phase correction times, $t_p$, utilizing a simplistic fixed hardware design. Additionally, these phase correction times are required to compensate for variations in the dynamic characteristics of the various sampling gates and other circuitry which are themselves dependent on temperature variations, component aging, mechanical stress and other environmental factors. Accordingly, an adaptive phase control system is required.

FIG. 4 is a simplified block diagram of the adaptive phase calibration loop. In FIG. 4, a high frequency test signal is applied to the input terminal 18 of the traveling wave sampling structure 10. The output data is sampled and routed to the microprocessor 56. Phase control data is directed to phase control DACs 58 on the data bus 60.

Referring to FIG. 1, the calibration signal generator 70 receives the 125 MHz clock signal and generates a high purity 1,000 MHz test signal that is locked to the clock signal. During the phase calibration cycle, the input switch 64 is switched to couple the second pole 68 of the switch 64 to the input terminal 18 of the transmission line 12.

FIG. 5 is a graph depicting the 1,000 MHz test signal. If this test signal were sampled by the first sampling gate at the zero crossing point of the signal (point $Z_O$) then, in the absence of propagation delay, each succeeding sample would also be taken at a zero crossing point, e.g., $Z_1$, $Z_2$, etc., because the period of the sampling signal is equal to the one nanosecond delay introduced by the delay lines 54. However, due to the propagation delay between sample gates the second sample will occur slightly before the zero crossing point e.g. point E, the third sample will occur at point F and so forth. Therefore, it is the object of the phase control system to adjust the timing of the sampling pulses from each driver 30 so that each sampling gate 22 samples the input signal within a desired range of the zero crossing points of the 1 GHz test signal, independent of propagation delays and component variations.

An algorithm for generating the phase control signals to offset errors due to phase propagation delay and dynamic response variations in the sampling gates will now be described with reference to the flow chart of FIG. 6. In FIG. 6, the control algorithm for a given sample gate, e.g. the first sample gate, is illustrated.

· The first sample gate samples the 1000 MHz test signal every clock period. The magnitude of the sampled data from the first high speed buffer 24 is then compared with an error parameter, $\Delta$, determined by the particular environment in which the sampling structure is to be utilized. If the magnitude of the sampled signal is less than $\Delta$, then the first sample gate is calibrated and the phase control signal is not changed. However, if the magnitude of the sampled signal is greater than delta then the phase control signal is incremented to change the value of $t_P$ and reduce the magnitude of the sampling error, $S_{PD}$. The phase calibration loop is cycled iteratively until the magnitude of the sampled signals from all sample gates is less than delta at which time the system is calibrated. In the present embodiment the minimum time increment $t_P$ is 3 picoseconds.

The microprocessor calibration loop is also utilized to correct for variations in DC gain and offsets inherent in the circuitry. The controllable switch 64 sequentially couples the positive calibration reference 67, negative calibration reference 63, and ground reference 65 to the input terminal 18 of the FISO sampling system 8.

The system samples each calibration reference and the system output data is stored in the microprocessor 56. The microprocessor 56 is programmed to calculate each parallel elements gain value from the output data generated by the FISO sampling system 8 in response to the positive and negative calibration level test signals. Each parallel element's DC offset value are calculated from the output data generated in response to the ground calibration level test signal.

These calculated gain and offset values are utilized by the microprocessor 56 to correct output data generated by the FISO sampling system 8 when sampling actual input waveforms.

The demultiplexed analog data from the DEMUXs 80 is next transferred to an analog memory array. In the present embodiment, the memory depth record length is 1,024 samples. FIG. 7 is a block diagram of the memory arrangement. The memories consist of thick film hybrid modules 100 internally arranged in a four by thirty-two rectangular array. Eight such hybrids 100 will provide the full memory depth. A total of sixteen memory locations are simultaneously addressed by each column driver. The full 1,024 memory requires 32 phase A columns and 32 phase B columns.

FIG. 8 shows the internal architecture of the memory hybrids and the structure of a single memory cell 152. During the write mode, the analog buses 162 are connected to the DEMUX outputs 86 through the FET write switches 159. Vertical columns of memory cells 152 are cyclically coupled to the analog buses 162 in synchronism with the appearance of valid analog data on the analog buses 162. The memory cell FETs 156 are driven into conduction by one of 32 column drivers 154 which cause memory capacitors 158 to become charged to the voltage value present on the analog buses to substantially greater accuracy than 10 bits. Once the charging process is complete (approximately 15 ns in the present embodiment) the FET switches 156 are turned off resulting in stored analog data on capacitors 158. Analog data can continually be rewritten into the memory cells resulting in the complete erasure of old stored data until the write mode is terminated at which time the last acquired analog data is stored in the memory cells.

The present system provides for full memory width pre-trigger recording capability. The contents of the system memory may be read to analyze data stored prior to the leading edge of an observed electronic event.

At the beginning of the read mode, FET switches 159 are opened while the read mode FET switches 165 are closed. Initially, reset FET switches 166 are also closed causing all analog buses to be discharged to the reference ground of node 167 by the action of virtual ground amplifier 160 which is a high gain FET input op-amp in this embodiment. Next, the reset switches 166 are opened in preparation for reading data. At this time one of 32 column strobes 154 activates allowing each of four FET switches 156 to connect the memory capacitors 158 to the analog buses 162. Since the read strobe switches 165 are closed, the capacitors 158 are connected to the virtual ground node 167 of the virtual ground amplifiers 160. The result is that virtually all of the charge is removed from capacitors 158 and is collected on the amplifier feedback capacitors 164. The resultant memory voltage is represented on the output of the amplifiers 160 and applied to the inputs of four terminals of the 32 to 1 multiplexer 120 of FIG. 1. Since there are 8 similar memory modules in each system, all 32 outputs of amplifiers 160 are applied to the 32:1 multiplexer 120. The multiplexer is then cycled applying each input to the 12 bit analog to digital converter 130 where the inputs are digitized and stored in digital form in standard semiconductor memory. After the digitizing cycle is complete the reset switches 166 are briefly closed, the first memory column is switched off, the reset switch is opened and the second column strobe 154 is activated initiating the second read cycle and so forth until all 32 columns have been read. Referring to FIG. 8, the positive or reference input node 167 of the virtual ground amp 160 is coupled to the DEMUX output 86 by a network consisting of R167 and R169. This circuitry provides a critical offset error correction function which will now be described.

During the read mode, controllable switch 64 (Refer to FIG. 1) couples the grounded pole 65 to the transmission line 12 thus establishing a "zero" reference. The input sampling gates 22 and the DEMUX modules 80 continue to sample this "zero" reference and transfer it to DEMUX outputs 86 along with all system DC offset associated with the mentioned circuitry. This offset is an error voltage which was also added to sampled data during the write mode and is consequently stored along with the desired data on storage capacitors 158. During the read mode the error offset voltage is subtracted from the desired data by means of network R167 and R168. These resistors are trimmed during manufacture to closely approximate the transfer gain (normally −1) of the memory cell capacitors 158 and the virtual ground output capacitors 164. By this means the DC offset errors and DC drift errors associated with the input circuitry is suppressed on the order of 50 to 1.

Note that the microprocessor controller calibration loop described with reference to FIGS. 4-6 also corrects for system offsets. However, the system is calibrated infrequently. The major factor causing DC offsets to shift between each calibration cycle is thermal drift caused by temperature changes in the system. Therefore, it is the objective of the offset error correction circuitry described in the previous paragraph to provide addition hardware implemented offset correction during each memory read cycle.

Referring to FIG. 9, the input traveling wave sampling structure consists of a traveling wave transmission line structure 12, having impedance $Z_C$, terminated with characteristic impedances 14 and 16. The transmission line 12 is a thick film structure comprising a metal film deposited on a printed hybird substrate. The sampling gates 22 are quad diode bridges utilizing Schottky diodes for fast response times. The length and characteristic impedance of the transmission line 12 are established so as to allow the hold capacitors 26 to charge to substantially 100% of the value of the signal on the transmission line within the conduction time of sampling bridge 22. The characteristic impedance $Z_C/2$ added to the effective resistance of sampling bridge 22 together with hold capacitor 26 must have an effective RC charging time constant of under 80 ps, in the present embodiment, to attain 10 bits of accuracy within the 600 ps conduction time of sampling bridge 22.

Also, the transient impulse associated with the charging of hold capacitor 26 must be absorbed by termination resistors 14 and 16 within the 600 ps conduction time of sampling bridge 22 otherwise any remaining transient impulse will corrupt the sampling accuracy of the system.

In the present embodiment the transient sampling impulse is progressively absorbed through multiple reflections which occur at the interface of transmission line 12 and terminating resistors R14 and R16. A transmission line of nominally 30 Ohms characteristic impedance and nominally 0.8" in length with the impedance of the termination resistors, including all parasitics, matched to the characteristic transmission line impedance to within ±10%, will cause the transient impulse to be sufficiently attenuated to enable the sampling system to attain 10 bits of accuracy.

The input signal current is applied to the traveling wave transmission line 12. Each phase adjustable bridge driver 30 generates an ultra high speed, precisely positioned sample pulse for activating its coupled sample gate 22. This sample pulse is passed through a balanced ferrite toroidal transmission line transformer 170. Bias resistors 171 turn on clamping diodes 172 and 173 except when the high speed pulse causes the diode bridge 22 to be placed in conduction. At this precise time, which is controlled to a few picoseconds, the diode bridge is placed in conduction charging the hold capacitor 26 to the value of the signal level on the traveling wave transmission line 12. The high impedance FET buffer 28, which is shown in detail in FIG. 12, buffers this signal for the demultiplexer circuit 80 (FIG. 1).

The high speed phase adjustable pulse generator 30 is shown in detail in FIG. 10. Referring now to FIG. 10, differential clock inputs 180 are coupled to the bases of differential pair 182 Q1 and Q2 through C1 and C2. The collector of Q1 is coupled to node 183, which in turn is coupled to nodes 184A and 184B of diode bridge 184 through the bases of transistors Q3 and Q4. The collector Q2 is coupled to node 182. Node 186 is coupled to pulsewidth control current source 188 and is also coupled to ground through diode D9. Node 186 is coupled to output node 190 through diode D8. Step recovery diode (SRD)2 192 has a first terminal coupled to output node 190 and a second terminal coupled to a drive node 194. SRD1 196 has a first terminal coupled to ground and a second terminal coupled to drive node 194. Both SRD1 and SRD2 196 and 192 conduct forward current from the first terminal to the second terminal.

The drive node 194 is coupled to node 184C of the diode bridge 184. A controllable drive current variable current source 198 is coupled to node 184D of the diode bridge 184 through inductor L. A controllable delay current source 200 is coupled to node 184E of the diode bridge 184. A phase adjust current input 36 supplies current to the delay current source 200.

Output node 190 is coupled to T1 input node 202 via diode D7. Balun T1 204 couples the T1 node 202 to the emitters of the differential pair Q6 and Q7 206. The collectors of Q6 and Q7 200A and B are coupled to the terminals of Balun T2 170. Terminals 208 are coupled to the quad-diode sampling gate 22.

The timing diagram illustrating the operation of this circuit is shown in FIG. 11. When the differential input signal of FIG. 11A is applied to the differential clock inputs 180, the voltage level at the transistor Q1 182A collector node 183 appears as FIG. 11B. During the negative half of the cycle the current charging the Step Recovery Diode, SRD1, (196) is equal to the difference between current source I3 (188) and the precision amplifier controlled current at collector of Q5 (200). When the waveform at node 183 goes positive, transistor Q2 (182B) acts as a current sink for the current source I3 (188). The precision amplifier controlled current source (200) is diverted through diode D4 (189A) and drive current source I₂ starts discharging the step recovery diode SRDI 196 through diode D5 (189D).

The relationship between waveform B, C, and D (FIGS. 11B, 11C, and 11D) will now be described. When waveform B is in its negative cycle the magnitude of the current through SRD2 192 is $I_{PW}=I_3$ and through SRD1 196 is $I_{PC}=I_3-I_4$. Because I₃ and I₄ are currents generated by precision, controllable current sources 188 and 200 the values of $I_{PW}$ and $I_P$ are controllable.

As is well known in the art, a step recovery diode (SRD) has low impedance and conducts when forward biased. When reverse biased, the impedance of the SRD remains low for a time period, $t_{SRD}$, determined by the charge stored, $Q_{SRD}$, in the SRD when it is forward biased. The magnitude of this stored charge is, in turn, determined by the amplitude of the forward bias current, $I_F$, multiplied by the time duration, $T_C$ of the forward current.

In the present system, $$Q_{SRD1}=I_{PC}T_C \quad (1)$$

and $$Q_{SRD2}=I_{PW}T_C \quad (2)$$

When waveform B is in its positive cycle current I₂ flows into the drive node 194. Referring to FIGS. 11C and 11D, from time to t₀ to t₁ current flows through SRD1 and the voltage level at the drive node 194 remains low. No current flows through SRD2 192 because of the small bias provided by diode D7. Accordingly, node 190 remains low.

At time t₁, the impedance of SRD1 196 snaps high. The interval $t_P=t_1-t_0$ is equal to $Q_{SRD1}/I_2$ or $(I_{PC}/I_2)T_C$. Accordingly, $t_P$ is controllable by controlling $I_{PC}=I_3-I_4$. In the present system, the magnitude of I₄ is controlled by varying the amplitude of the current at the phase adjust input 36.

The phase delay, $t_P$, is controlled by changing the phase control current level at phase delay input 36. The level of the phase control current is set by the microprocessor 56 during calibration. Since the magnitude of $t_P$ depends on $Q_{SRD1}$, SRD1 196 is denoted the phase control SRD.

At time t₁, current starts to flow through reverse-biased SRD2 192. Accordingly, a voltage output pulse 190A is generated at node 190. The rise time of the leading edge of the output voltage pulse is very small, about 75 picoseconds, because of the short transition time of the phase control SRD1 196.

At time t₂, the impedance of SRD2 192 snaps high. The internal $t_{PW}=t_2-t_1$ is determined by $Q_{SRD2}/I_2$ or $(I_3/I_2)T_C$. The pulse width, $t_{PW}$ is controlled by carrying I₃. SRD2 192 is denoted the pulse width control SRD.

At time t₂, current stops flowing through SRD2 185. Accordingly, the voltage at the output node 190 drops to zero. The fall time of the trailing edge of the pulse 190A is very small because of the short transition time of the phase control SRD2 192.

The waveform at node 202 takes the form of FIG. 11E due to the reflection of the incident pulse from the mismatched interface between the transmission-line transformer 204 and the emitters of output transistors 206A and B. The unbalanced to balanced (Balun) transmission line transformer 204 serves to convert a single ended pulse at node 202 into a differential pulse at transistors 206A and B. The resultant differential output at node 208 appears as shown on FIG. 11F. The pulse delay $T_P$ is directly proportional to the voltage at the phase adjustment input 36 and is controllable over a range of ±300 ps while the pulse width is held constant to within 5 ps. Obviously different values can be obtained with different component values. Current source I₃ (188) can be adjusted for variable pulse width.

The high speed buffers 24 of FIG. 1 are shown in FIG. 12. This circuit serves as a very high impedance input for capacitor 26, while serving at an ultra high frequency, buffer amplifier/driver for the DEMUX 80. This circuit consists of three Gas Fet Transistors 300, 301, and 302. The Gas Fet 302 serves as a high impedance current source for the input Gas Fet 301. Gas Fet 300 serves as a bootstrap driver to Fet 301 to guarantee that the bias conditions of Fet 301 remain constant and independent of the input signal level which eliminates non-linearities and thermal transients. The capacitor 303 in combination with transistor 300 provides a small controlled amount of positive feedback to hold capacitor 26 to effectively reduce the time required to charge capacitor 26 to 10 bits of accuracy. Transistor 304 serves as an emitter follower buffer and transistors 305 and 306 provide a high frequency cascade emitter follower pair to drive the buffer amplifier output, 307. Resistors 309 and 310 form a network to backmatch the transmission line input of the DEMUX circuit shown in FIG. 13 and absorb reflections.

The DEMUX 80 shown in FIG. 1, is a one input, four channel demultiplexer as shown block diagrammatically in FIG. 13. The detailed shcematic of one of four identical channels is shown in FIG. 14. The inout 79 is a strip line transmission line 310 driven from the high speed buffer 24 of FIG. 1 and detailed in FIG. 12. The diode bridge 311 is a balanced quad of Schottky diodes which are driven from a balanced toroidal pulse transformer 312. Transformer 312 receives its drive from a differential pair amplifier 313 which converts a single ended sample strobe at input 314. When the drive pulse is applied to the diode bridge 311, the hold capacitor 315 is charged to substantially 100% of the value of the input 79. The diode bridge is then turned off leaving a charge on hold capacitor 315. The high impedance of the MosFet buffer 316 assures the holding time for the capacitor 315. MosFet 317 provides a boot-strapped drive to 316 for precisely the same reasons described in relation the the very similar circuitry of FIG. 12. The output amplifier 318 then buffers and translates the signal for proper input to the memory hybrids 100 as shown in FIG. 1.

The invention has been explained with reference to specific embodiments. Other embodiments will now be apparent to those of ordinary skill in the art. For example, an arbitrary number of sampling gates and associated circuitry can be utilized in the invention. For the general case of N sampling gates, the overall sampling frequency would be $Nf_C$ and the overall output data rate would be $f_C/N$. Additionally, the clock signal delay circuitry could include independent delay lines routed to the bridge drivers instead of the daisy chained arrangement described above. The adaptive phase control loop does not require that the test signal be sampled at the zero crossing point, rather any arbitrary point on the test signal could be utilized. Further, the outputs from the multiplexers could be directly coupled to high speed analog converters such as CCDs or flash converters, thereby resulting in a continuous N gigahertz sampling/digitizing system.

The converter need not run at a constant speed as depicted, but, could be slowed down by a multiplicity of means including cyclically disabling the timing strobes to the DEMUX modules so as to store for example, only every third or every fifth sample and so forth. The effective system sample rate for the given examples would decrease to one-third and one-fifth respectively of the maximum sample rate without sacrificing any other performance parameter or memory depth.

Accordingly, it is intended that the invention not be limited except by the appended claims.

What is claimed is:

1. A high-speed sampling system comprising:
   a transmission line for transmitting a signal;
   means for coupling an input signal to said transmission line;
   a plurality of sampling gates coupled, respectively, to like plurality substantially equispaced points on said transmission line with each of said sampling gates adapted to receive an enabling pulse;
   a like plurality of storage means coupled to corresponding sampling gates, with each sampling gate for transferring the amplitude of the input signal at the point on said transmission line coupled to the sampling gate to the storage means coupled to the sampling gate when the sampling gate receives an enabling pulse;
   means for generating an ordered like plurality of equispaced timing signals with each timing signal associated with a given one of said sampling gates;
   means for generating an ordered like plurality of phase signals with each one of said phase signals associated with a given one of said timing signals and displaced from its associated signal by an adjustable phase delay interval;
   adaptive means to adjust the displacement of each of said phase signals from its associated timing signal to compensate for propagation delay and for noncontrollable hardware and temperature induced delays; and
   a like plurality of enabling pulse generators, each enabling pulse generator coupled to a corresponding one of said sampling gates, adapted to receive the timing signal and phase signal associated with the corresponding sampling gate, and including a pair of step recovery diodes, characterized by a transition time between a high-impedance state and a low-impedance state of about 75 picoseconds, with each step recovery diode having a first terminal coupled to a common node, with each enabling pulse generator for generating an enabling pulse displaced from the timing signal associated with the corresponding sampling gate by the adjustable phase delay defined by the displacement between the timing signal and phase signal associated with the corresponding sampling gate with the rise time of the leading edge and fall time of the trailing edge of said enabling pulse being about 75 picoseconds to provide the precise timing required to sample signals at Gigahertz sampling rates.

2. The invention of claim 1 wherein said adaptive means comprises:
   a test signal generator for generating a periodic signal with the period of the signal substantially equal to the time interval between adjacent timing signals;
   means for coupling said test signal to said transmission line; and
   means for adjusting the value of each phase signal so that the amplitude of the test transferred to each storage means is less than some predetermined value.

3. The invention of claim 2 wherein said timing signal generating means comprises:
   a clock signal generator for generating a clock signal at a selected clock frequency and given clock period; and
   a delay line, having a like plurality of outputs and adapted to receive said clock signal, for delaying said clock signal between successive outputs by a selected fraction of said clock period, with the delayed clock signals at said delay outputs being said ordered set of timing signals.

4. A high-frequency sampling system comprising:
   a transmission line, with terminal impedance matched to the characteristic impedance of the transmission line, for receiving an input signal at an input terminal;
   N sampling terminals coupled to said transmission line, with said N terminals being substantially equally distributed along said transmission line and separated by a distance D, with said N terminals being sequentially numbered from 1 to N, and with the first sampling terminal being nearest to the input terminal of the transmission line;
   N sampling gates, with said N gates being sequentially numbered from 1 to N for identification and with each sampling gate coupled to the sampling terminal identified by the same number, said sampling gates for sampling the input signal when activated by a sampling pulse;
   N sampling gate output buffers, with said N buffers numbered from 1 to N for identification and with each buffer coupled to the sampling gate identified by the same number, said buffers for holding the value of sampled input signal for the period between sampling pulses and for providing an output signal at a buffer output port, with magnitude of the output signal substantially equal to the magnitude of the sampled input signal;
   a system clock for generating a clock input signal, Q, having frequency $f_C$ and period $T_C$;
   N sampling gate drivers, with said N drivers being sequentially numbered from 1 to N for identification, and with each driver coupled to the sampling gate identified by the same number, with said drivers for receiving said clock input signal and a phase control signal and for generating said sampling pulse at time $t_S$, where $t_S = t_I + t_P$, where $t_I$ is the time that the clock input signal is received at the ith driver, and $t_P$ is a variable phase delay having a magnitude determined by the phase control signal;
   clock signal delay means for delaying the receipt of the clock input signal at the kth driver, k=1 to N, by $(k-1)t_D$ is a fixed time delay equal to $T_C/N$, with said clock signal delay means for clocking the sampling gates to achieve an overall sampling rate of $Nf_C$;
   means for generating N phase control signals, said N phase control signals numbered from 1 to N for identification, and for directing the mth control signal to the mth driver, m=1 to N, and for controlling the magnitude of each phase control signal to vary the magnitude of $t_P$ in each driver to compensate for input signal propagation delay and variations in the dynamic characteristics of the sampling gates; and N DEMUXs, with said N DEMUXs numbered from 1 to N for identification, and with the input of each DEMUX coupled to the output of a buffer identified by the same number, each DEMUX having N outputs for outputting N succeeding buffer outputs occurring over a time period of $NT_C$ and with the output data rate of said DEMUXs equal to $1/N \, f_C$.

5. The invention of claim 4 further comprising:
an analog memory array having inputs coupled to the outputs of said DEMUXs and having an analog output terminal.

6. The invention of claim 4 further comprising:
a high speed analog to digital converter coupled to each of said DEMUX outputs;
means for multiplexing the digital outputs of the analog to the digital converters to provide a continuous digital output data stream.

7. The invention of claim 5 or 6 wherein each of said drivers comprises:
a precision SRD pulse generation system for generating and positioning a high precision, controlled sub-nanosecond sample pulse.

8. The invention of claim 4 wherein said means for generating said phase control signals comprises:
means for providing a test signal at said input terminal, with the frequency of said test signal equal to $(N/L)f_C$ where, if N is an even integer, L is any N odd integer, or, if N is an odd integer, L is any even integer;
means for sampling the test output data generated from sampling the test signal; and
means for adjusting the magnitude of the phase control signal based on the value of the sampled output data to adjust the magnitude of the test output data to predetermined values.

9. The invention of claim 4 further including a gain variation and DC offset correction loop comprising:
means for providing a test signal for determining each parallel element's offsets,
means for providing a test signal for determining each parallel element's gain,
means for utilizing the resulting store of offsets and gains to manipulate the real time output provided by the high-frequency sampling system to correct for gain variations and offsets.

10. The invention of claim 5 further comprising:
a hardware offset error correction means which substracts system offset errors from stored analog data as it is read out of memory arrays.

11. The invention of claim 4 wherein the width of said sampling pulse is $t_{PW}$, and wherein the length of said transmission line and values of said terminal impedance causes transient impulses associated with said sampling gates to be attenuated by a selected factor within time $t_{PW}$.

12. The invention of claim 11 further comprising:
a plurality of MUX circuits coupled to the outputs of said memory array.

* * * * *